United States Patent [19]

Assael et al.

[11] Patent Number: 4,908,875
[45] Date of Patent: Mar. 13, 1990

[54] ADAPTIVE THRESHOLDING TECHNIQUE

[75] Inventors: David Assael, Agoura; Brian Lincoln, Agoura Hills, both of Calif.

[73] Assignee: Hughes Aircraft Company, Los Angeles, Calif.

[21] Appl. No.: 326,571

[22] Filed: Mar. 21, 1989

[51] Int. Cl.[4] .............................................. G06K 9/00
[52] U.S. Cl. ..................................... 382/52; 382/50; 358/463; 358/466; 307/358; 341/155
[58] Field of Search ............................. 382/50, 52, 54; 358/466, 463; 341/131, 139, 155; 307/358

[56] References Cited

U.S. PATENT DOCUMENTS

| | | | |
|---|---|---|---|
| 3,472,958 | 10/1969 | Estock | 382/52 |
| 4,012,715 | 3/1977 | Essenmacher | 382/52 |
| 4,272,789 | 6/1981 | Biron | 358/466 |
| 4,431,993 | 2/1984 | Van Der Mark | 307/358 |
| 4,520,280 | 5/1985 | Yoshikawa et al. | 382/50 |

Primary Examiner—Leo H. Boudreau
Assistant Examiner—Yon Jung
Attorney, Agent, or Firm—Michael W. Sales; W. K. Denson-Low

[57] ABSTRACT

An adaptive thresholding technique is calculated by using a real-time 16 pixel running average (RA) 18 to which is added on offset value. The offset value 38 is the product of a programmable factor (alpha) and a Sum Absolute Difference (SAD) noise measurement. The adaptive threshold 42 is compared by a comparator 48 with a delayed analog video signal intensity value on line 46 for the pixel associated with the adaptive threshold. The comparator 48 provides a binary video output for further processing. A relative video output may also be provided by taking the difference of the analog video signal 46 and its corresponding running average 18.

14 Claims, 3 Drawing Sheets

ADAPTIVE THRESHOLDING TECHNIQUE

BACKGROUND OF THE INVENTION

1. Technical Field

This invention relates to image processing techniques and, more particularly, to a method and apparatus for thresholding analog video signals.

2. Discussion

One of the major problems in performing efficient digital processing of an image is to properly digitize the analog video signal from the detector or source. Traditionally, the amplitude or intensity of the analog video signal from the detector is compared against a fixed threshold. Analog levels above the threshold are converted to a binary or digital one whereas analog signal levels below the fixed threshold are converted to a digital zero level.

The chosen thresholding technique should allow detection of the target signal in the various kinds of noise that are possible. There are two primary kinds of noise. One is low-frequency shading or scan noise that can be likened to a parabola along the scan direction. The other kind of noise is high frequency noise generated by the detector itself. As shown in FIG. 1, a fixed thresholding technique creates false detections that are due to noise instead of actual scene content.

In selecting criteria on which to base a threshold level, a designer is usually trapped between conflicting limitations. If the threshold is weighted too heavily toward the background (a "low" threshold), excessive digitization or clutter may occur. On the other hand, if the threshold is set too "high", a loss of digitized target pixels may result. The use of a low-pass filter does not provide advantageous results because the low frequency noise component would cross the threshold, just as a high-pass filter would allow the high frequency noise component to cross the threshold. A band pass filter is not easily implementable because there is little reliable information within the target spatial frequency prior to target selection. This is due to the uncertainty in target size, range to the target or the unknown effects of image blur of the target signal.

SUMMARY OF THE INVENTION

In accordance with the teachings of the present invention, an adaptive threshold level is set for each pixel position against which the analog signal is compared. The adaptive threshold level is a function of a running average of the analog video signal to which an offset valve is added. The offset value is a function of a global measure of the noise as well as a function of the noise generated by the detector.

BRIEF DESCRIPTION OF THE DRAWINGS

The various advantages of the present invention will become apparent to those skilled in the art after reading the following specification and by reference to the drawings in which.

DESCRIPTION OF THE PREFERRED EMBODIMENT

Figure 1A:
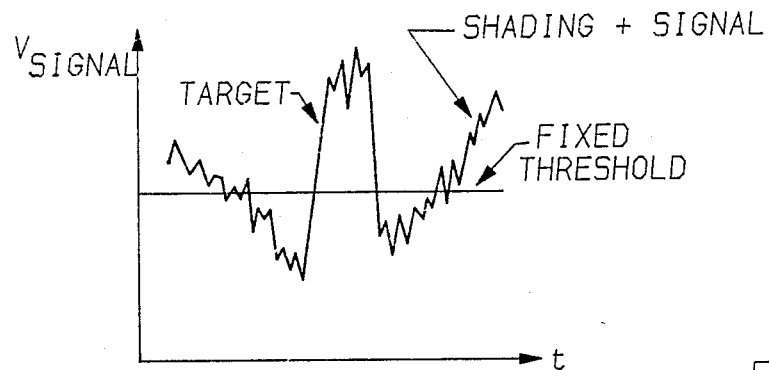
FIG. 1(A-B) are graphs illustrating a fixed thresholding technique of the PRIOR ART.
Figure 1B:
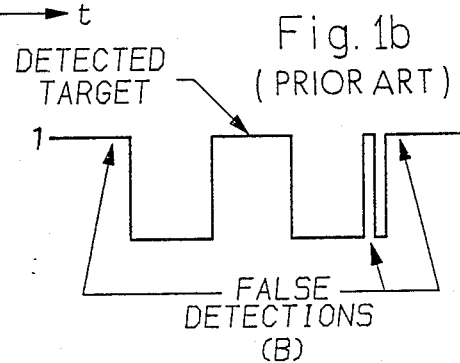

In accordance with the teachings of the present invention, a method and apparatus is provided for thresholding analog video signals in such a way that real objects or potential targets can be detected although various kinds of noise exist in the video signal. The analog signals can be derived from a variety of sources such as an infrared scanning focal plane array disclosed in various publications by the assignee of the present invention. One of the primary objectives of this invention is to provide a thresholding technique that distinguishes the target signal from low-frequency scan noise or shading, as well as high frequency detector noise. To this end, this invention provides an adaptive threshold for each pixel. As is known in the art, each frame of video data is divided into a matrix of pixels having a number of rows and columns. By way of a nonlimiting example, a bidirectional scanning focal plane array with two sets of 120 detectors each can be staggered and multiplexed together to generate a 240 pixel X 240 pixel array or field of view (FOV). The intensity of the analog signal at each pixel position is ideally a function of a characteristic (e.g., infrared radiation emanating therefrom) of objects within the scanned scene. Unfortunately, the intensity of the analog signal is detrimentally also a function of noise. As indicated in the discussion of FIG. 1, the two primary kinds of noise are low-frequency shading and high frequency noise from the detector. Because the magnitude of noise may vary from one detector to the next and also along each scan, an adaptive thresholding approach is provided for each pixel. Pixels with intensity values above their corresponding adaptive threshold limits are digitized or binarized for further processing.

In accordance with the present invention, the adaptive threshold comprises a running average of the analog signal to which an offset value is added. The offset value is a function of a global measure of noise (alpha), as well as a function of noise specifically associated with the detector which is referred to herein as the "Sum Absolute Difference" (SAD).

The thresholding technique can be used in this embodiment to convert live video into "relative video", as well as "binary video". Binary video comprises an array of digital ones or zeros depending on whether the intensity value of the analog signal is above or below the adaptive threshold for a given pixel. The relative video provides data, for each pixel position, that is a function of the relative difference between the intensity of the analog signal and the running average used to calculate the adaptive threshold for each pixel position. The adaptive threshold is calculated by adding an offset to a baseline average of the incoming signal. The baseline average is set by calculating a running average of the video signal from each detector to smooth high frequency noise components, and to counter low-frequency non-uniformities from the detector. The offset is calculated by multiplying the global measure of the noise (alpha) by a measure of the noise per detector. The size of the offset can affect the number of false alarms and the target size. The offset is adjusted as a balance between minimizing the noise crossings while ensuring a high probability of detection. The noise per detector is calculated by taking an average of the difference between the live video and the running average in a sample window.

The adaptive threshold level for each pixel is defined by the following equation (1):

$$T_{ij} = RA_{ij} + \alpha \cdot SAD_j \quad (1)$$

Where:
$T_{ij}$ = the threshold for pixel $i$ of line $j$;
$RA_{ij}$ = the $N$-pixel running average of intensities of the input video that corresponds to the pixel $i$ on column $j$; (See FIG. 3)
$i = 1,2,3, \ldots, Y$, is the line number;
$Y$ = vertical size of the FOV
$j = 1,2,3, \ldots, X$, is the column number within the FOV;
$X$ = horizontal size of the FOV
$N$ = the window size for the running average (RA)
$\alpha$ = noise based multiplying factor, controllable by software
$SAD_j$ = Sum Absolute Difference of the input video and the running average in a selected $M$-pixel window along each column.

The Sum Absolute Difference ($SAD_j$) is defined in accordance with equation (2):

$$SAD_j = \frac{\sum_{i=1}^{M} |RA_{ij} - Video_{ij}|}{M} \quad (2)$$

Figure 2:
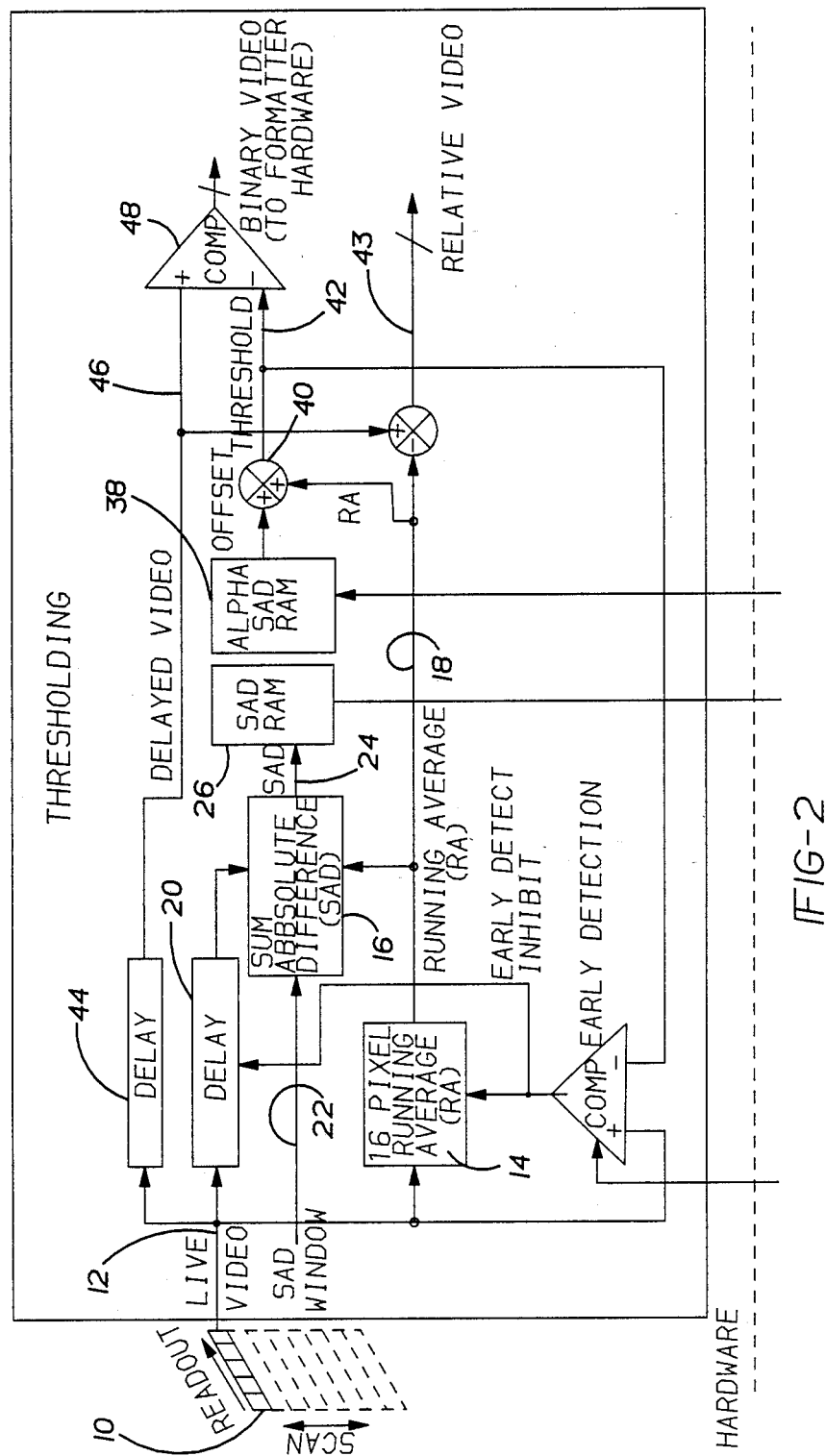
FIG. 2 is a block diagram of system components for carrying out the teachings of the present invention.
Figure 2A:
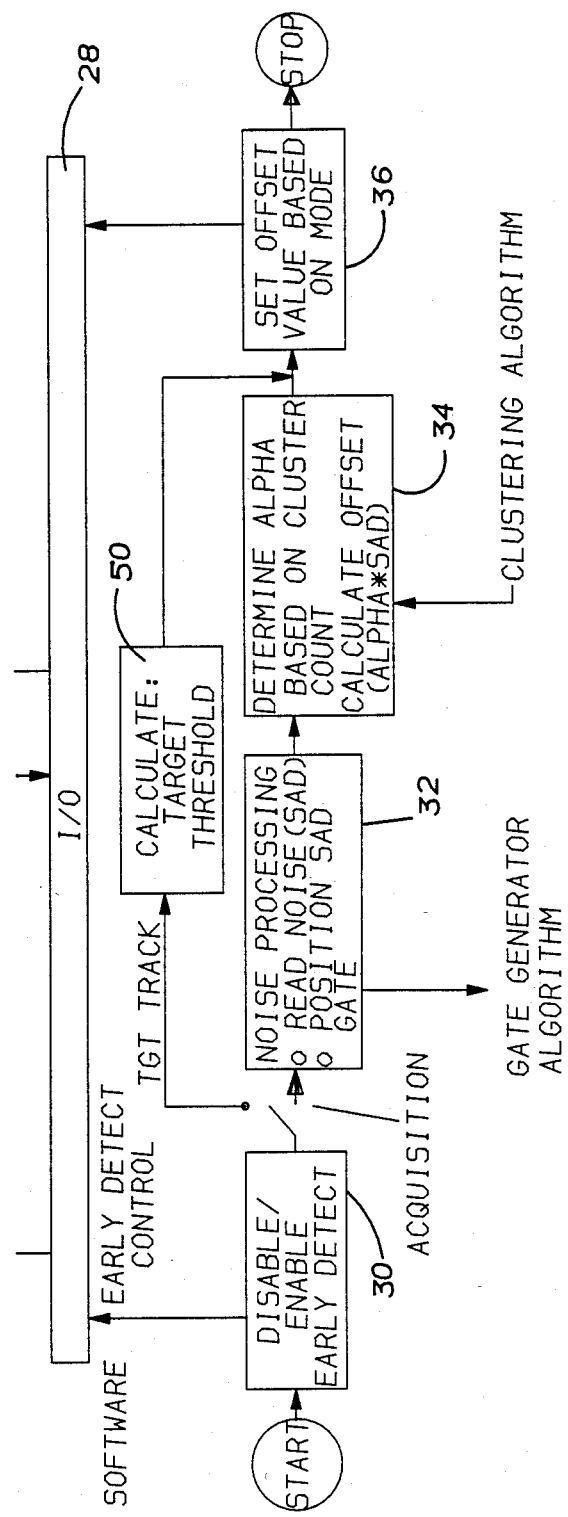

Where:
$M$ = SAD window length
$RA_{ij}$ = Running Average of pixel $i$, in column $j$
$Video_{ij}$ = Video intensity of pixel $i$, in column $j$ The method of the present invention can be carried out in a variety of different hardware/software approaches. FIG. 2 illustrates a hybrid approach where hardware is used to process the live video to generate certain parameters while the software provides many of the calculations, as will appear.

Figure 4A:
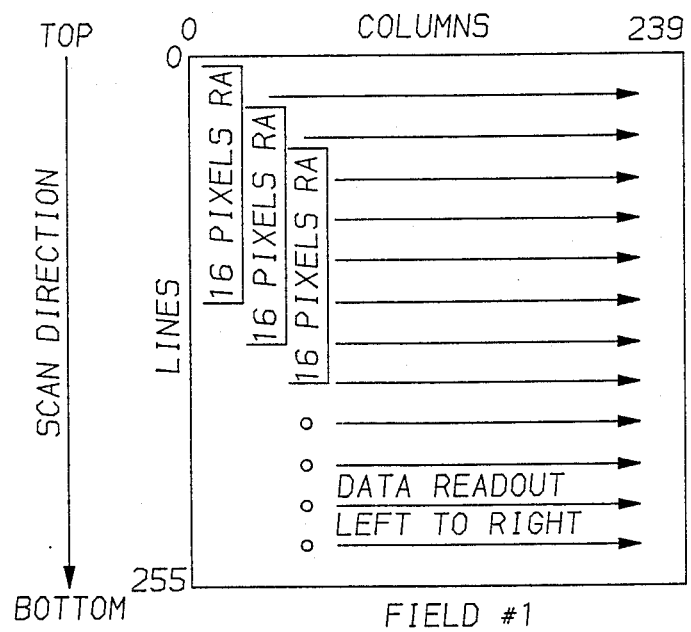
FIG. 4(A-B) are illustrations of two frames of video input signals showing the derivation of the running average for each column of pixels.
Figure 4B:
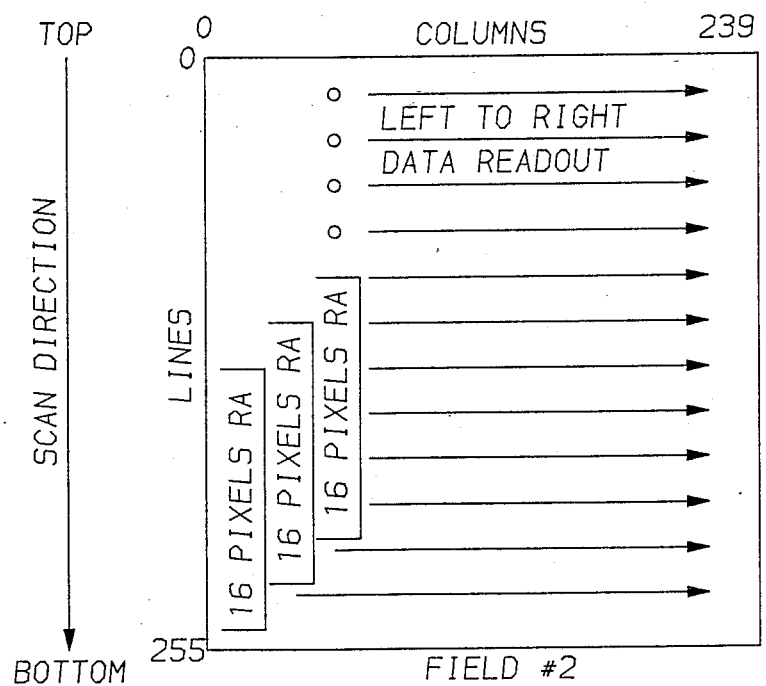

In FIG. 2, the live video from the detector 10 is applied over line 12 to circuitry 14 for calculating the running average. With additional reference to FIG. 4, a 16 pixel running average has been chosen. Thus, N equals 16 for equation (1). The running average (RA) is calculated for each column as illustrated in FIG. 4 by adding the intensities of a group or window of pixels along a column and dividing the sum by the number of pixels (here, 16) in the window. The running average for each column thus provides a measure of the local noise mean. A local standard deviation is measured by calculating the "Sum Absolute Difference" (SAD) by circuitry 16. Circuitry 16 accepts the running average (RA) output on line 18 and the live video which has been delayed by suitable delay circuitry 20. Provision can be made for defining the SAD window on line 22. The SAD gate defines the SAD window length M in equation (2). For the estimate of the local standard deviation of the noise to be correct, only noise should be included in the sample window. However, the target could be located anywhere in the video frame prior to target selection. To counter this problem, the SAD window position alternates from top to bottom of the frame based upon the scan direction as shown in FIG. 4. This ensures that the target will not consistently be located in the SAD window. The SAD window is controllable by software and may range from 4–16 pixels. In this embodiment, M equals 16.

Circuitry 16 outputs on line 24 the Sum Absolute Difference of equation (2). The SAD values for each of the SAD windows within a frame is stored in memory 26 and provided to the software through a suitable input/output interface 28.

Prior to target selection, the early detect function block 30 is disabled and the software proceeds along the acquisition line to read the noise information from RAM 26 and reposition the SAD window, if desired. This function is represented by block 32 in FIG. 2. As represented by block 34, the software then proceeds to define alpha. The calculation of alpha is based on the current false alarm rate ($P_{FA}$) and the predetermined system probability of detection ($P_{Det}$). Alpha is a positive number and is initialized to a value corresponding the desired probability of detection where:

$$P_{Det}(x) = 0.5\left[1 + erf\left(\frac{SNR - TNR}{\sqrt{2}}\right)\right] \quad (3)$$

$$P_{FA}(x) = 0.5\left[1 - erf\left(\frac{TNR}{\sqrt{2}}\right)\right] \quad (4)$$

$$erf(x) = \frac{2}{\sqrt{\pi}} \int_0^x e^{-t^2} dt \quad (5)$$

SNR = Signal to noise ratio
TNR = Threshold to noise ratio
erf = error function defined in equation (5)

If the desired probability of detection is 0.99 and a constant false alarm rate of three false alarms or less per field in the field of view should maintain, this implies that the minimum TNR should be four. However, because the SAD measurement is approximately 0.8 of the actual noise standard deviation, alpha should be initialized to 5.0 (four divided by 0.8) for a 240X240 field of view. The value of alpha is software controllable to compensate for incorrect assumptions made about the noise or target intensity so that alpha can be adjusted to maintain the desired false alarm rate. For example, alpha can later be determined based upon cluster count. If there are too many clusters, alpha should be raised whereas if too few clusters are detected, alpha should be lowered. Consequently the threshold level can be optimized. Once alpha is chosen, the software calculates the offset by multiplying alpha by the previously generated SAD data. In the acquisition mode, this offset value passes through functional block 36 back to the alpha-SAD memory 38 in the hardware.

Figure 3:
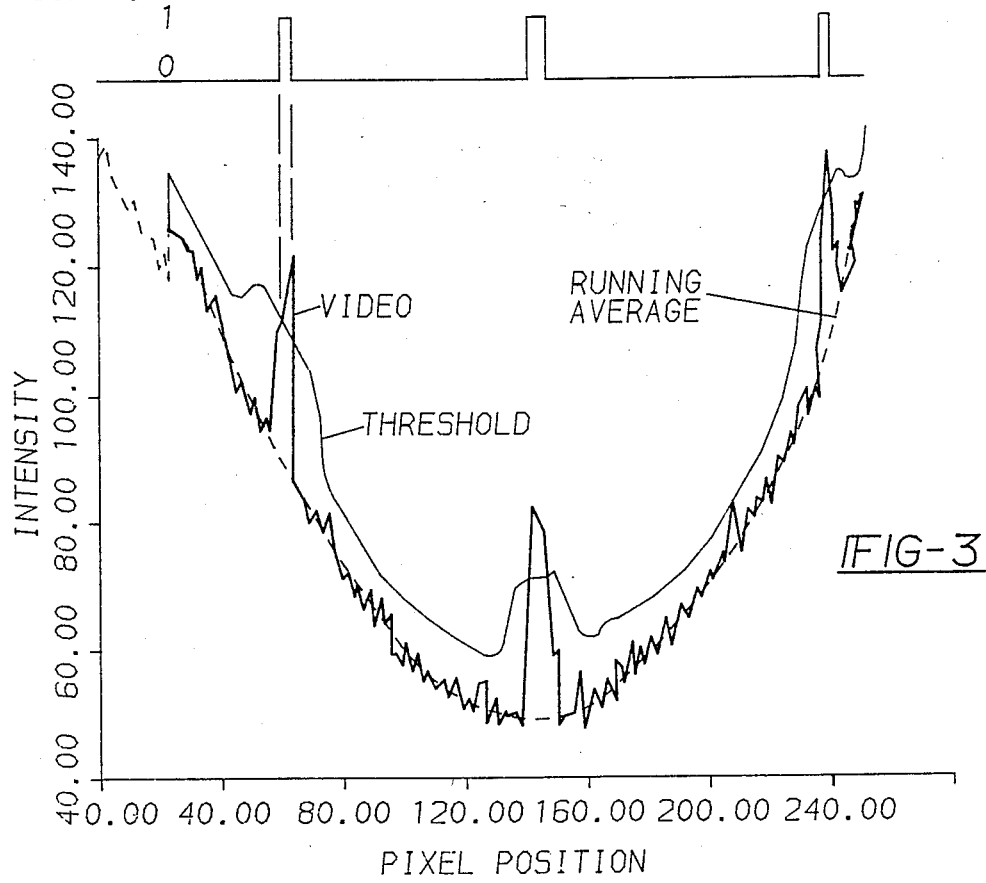
FIG. 3 is a graphical illustration of how the analog video signal is binarized by the adaptive thresholding technique of the present invention.

Summing node 40 serves to add the offset from memory 38 to the running average to generate the adaptive threshold on line 42 for a given pixel. Summing Node 41 subtracts the running average from the pixel intensity to generate the Relative Video value on line 43. The live video on line 12 has been suitably delayed by delay 44 to synchronize the presentation of the pixel intensity value on line 46 with its corresponding threshold on line 42. Comparator 48 provides the binary video output by comparing the analog video signal intensity value on line 46 with its corresponding threshold on line 42. If the intensity value is above the threshold, the comparator provides a digital one binary output. If the intensity is below the threshold, then a binary zero level is provided by comparator 48. This process is graphically illustrated in FIG. 3. The analog video input signal generated on line 12 (FIG. 2) is labeled "VIDEO" in FIG. 3. The running average generated on line 18 (FIG. 2) is labeled "RUNNING AVERAGE". When the offset (alpha X SAD) is added to the running average, the ultimate threshold is generated. The threshold bears the label "THRESHOLD" in FIG. 3 and is provided on line 42 in the FIG. 2 implementation. FIG. 3 illustrates the digitization of one scan line. This process continues for every scan line in the field of view or frame. The thresholding process continues frame by frame. The offset or (alpha X SAD) term remains constant for each column of video, and the alpha term remains constant for each frame of video. If the estimated SAD term is zero then a predetermined minimum constant is added to the running average to obtain a new threshold value. A study of FIG. 3 reveals that the use of the running average only as the adaptive threshold would compensate for low frequency noise or shading, however, it would not operate to filter out the high frequency noise. Consequently, the offset is added to the running average to accomplish this function.

The previous discussion was directed to the method of thresholding that is implemented prior to target selection. For target track mode, this method could be adjusted so that only one object is thresholded within the track or background gates. Once this point is reached, alpha could be kept constant to ensure the stability of thresholded target image from jitter. This is provided in FIG. 2 by enabling the Early Detector control of block 30. After target selection, the tracker can generate a reliable estimate of the target intensity. A more accurate threshold can then be set by using an estimate of the target's intensity, rather than basing the threshold on an estimate of noise. When this stage is reached, the software switches from the Acquisition mode to the Target Track mode. Block 50 is then used to calculate a different adaptive threshold.

In view of the foregoing, those skilled in the art should appreciate that the present invention provides an adaptive thresholding technique that can be used in a wide variety of applications. The various advantages should become apparent to those skilled in the art after having the benefit of studying the specification, drawings and following claims.

What is claimed is:

1. In an image processing system where analog video signals from a detector are converted for further processing, the conversion being a function of a comparison of the analog video signal intensity level relative to a threshold, the analog video signal being associated with a matrix of pixels arranged in a plurality of rows and columns, the improvement comprising:
   means for defining an adaptive threshold level against which the analog video signal level for each pixel position is compared, said means including:
   (a) means for calculating a running average of the intensity of the analog video signal; and
   (b) means for adding an offset value to the running average, said offset value being a function of a global measure of noise (alpha) in the system and a function of noise specifically associated with the detector (SAD).

2. The system of claim 1 wherein said offset value is defined by the equation:

alpha(SAD$_j$), where:
   alpha is a positive number; and
   SAD$_j$ is the sum of the absolute difference of the analog video signal and said running average.

3. The system of claim 2 wherein SAD$_j$ is defined as:

$$SAD_j = \frac{\sum_{i=1}^{M} |RA_{ij} - \text{Video}_{ij}|}{M}$$

Where:
$M$ = SAD window length
$RA_{ij}$ = Running Average of a pixel $i$ in column $j$
Video$_{ij}$ = Video intensity of a pixel $i$ in column $j$ 4. The system of claim 3 which further comprises:
   comparison means for comparing the analog video signal for each pixel with its corresponding threshold and providing a binary one output if the analog level is above the threshold and a binary zero output if the analog level is below the threshold thereby providing a binary video output.

5. The system of claim 3 which further comprises:
   comparison means for providing an output which is a function of the relative difference between the analog video signal level for a pixel and said running average associated with that pixel thereby providing a relative video output.

6. An image processing system for analyzing analog video signals having intensities associated with various pixel positions arranged in a matrix of rows and columns, said system comprising:
   input means for receiving said analog video signals;
   running average (RA) means for calculating a running average of the intensity of a group of pixels in each column;
   SAD means for calculating a SAD factor which is the sum of the absolute difference of the video signals and the running average in a selected window along each column;
   alpha generator means for generating an alpha factor which is a positive number based on a false alarm rate and desired probability of detection for the system;
   multiplier means for multiplying the alpha factor with the SAD factor to generate an offset value;
   summing means for summing the running average with the offset to provide an adaptive threshold level for each pixel; and
   comparison means for comparing the adaptive threshold level for each pixel with the analog video signal intensity for that pixel, the comparison means generating a binary one output if the video level is above the threshold and a binary zero level if the video level is below the threshold.

7. The system of claim 6 wherein the video signal is derived from a detector which scans from top to bottom and then from bottom to top, and wherein the SAD window is positioned in each column depending upon the direction of the scan of the detector.

8. The system of claim 7 wherein the SAD window is 16 pixels in length along a column.

9. The system of claim 6 which further comprises:
   difference means for providing the relative difference between the analog video signal intensity and its associated running average thereby providing a relative video output.

10. A method of thresholding analog video signals having intensity levels associated with a matrix of pixels arranged in rows and columns, said method comprising:

generating a running average (RA) value of the analog video signal over a plurality of pixels;

generating a Sum Absolute Difference (SAD) value by taking the difference of the analog video signal and the running average value in a selected window;

generating an alpha factor as a positive number which is associated with a global measure of noise and a desired system probability of detection;

multiplying the SAD value by the alpha value to generate an offset;

adding the offset to the running average to generate an adaptive threshold level for each pixel; and digitizing each pixel of the analog video signal to a binary one if the intensity is above its adaptive threshold and to a binary zero if the intensity is below its adaptive threshold level.

11. The method of claim 10 wherein SAD value is calculated according to the following equation:

$$SAD_j = \frac{\sum_{i=1}^{M} |RA_{ij} - \text{Video}_{ij}|}{M} \quad (2)$$

Where:
$M$ = SAD window length
$RA_{ij}$ = Running Average of pixel $i$, in column $j$
$\text{Video}_{ij}$ = Video intensity of pixel $i$, in column $j$ 12. The method of claim 11 wherein said SAD window has a length of 16 adjacent pixels in a column.

13. The method claim 10 wherein said analog video signal is generated by a scanning detector which reversely scans in opposite directions, and wherein the location of the SAD window in the matrix is a function of the direction that the detector is scanning.

14. The method of claim 10 which further comprises:
generating a relative video output for each pixel position which is a function of the difference between the analog video signal intensity and its corresponding running average.

* * * * *